United States Patent
Sibigtroth et al.

(10) Patent No.: US 7,187,600 B2
(45) Date of Patent: Mar. 6, 2007

(54) METHOD AND APPARATUS FOR PROTECTING AN INTEGRATED CIRCUIT FROM ERRONEOUS OPERATION

(75) Inventors: James M. Sibigtroth, Round Rock, TX (US); George L. Espinor, Austin, TX (US); Bruce L. Morton, Lakeway, TX (US); Michael C. Wood, Pflugerville, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 162 days.

(21) Appl. No.: 10/946,951

(22) Filed: Sep. 22, 2004

(65) Prior Publication Data

US 2006/0062070 A1    Mar. 23, 2006

(51) Int. Cl.
*G11C 7/00*    (2006.01)

(52) U.S. Cl. .................. 365/196; 365/189.09; 365/195

(58) Field of Classification Search ................ 365/226, 365/195, 189.09, 185.29, 196, 185.23
See application file for complete search history.

(56) References Cited

U.S. PATENT DOCUMENTS

| | | | | |
|---|---|---|---|---|
| 5,801,987 A | * | 9/1998 | Dinh | ...................... 365/185.18 |
| 5,835,537 A | * | 11/1998 | Ichii et al. | ................... 375/295 |
| 5,890,191 A | | 3/1999 | Espinor | |
| 5,894,423 A | | 4/1999 | Ling et al. | |
| 6,667,928 B2 | | 12/2003 | Honma et al. | |
| 2005/0146949 A1 | * | 7/2005 | Munguia et al. | ........ 365/189.11 |

OTHER PUBLICATIONS

Topping, "Techniques to Protect MCU Applications Against Malfunction Due to Code Run-Away," Motorola Engineering Bulletin, Digital DNA, 2002, pp. 1-12.
Racino, "Resetting Microcontrollers During Power Transitions," Motorola Semiconductor Application Note, 1998, pp. 1-16.
Oliviera, "HC908QY4/QT4 Microcontroller (MCU) Application Hints," Motorola Application Note, Digital DNA 2003, pp. 1-11.

* cited by examiner

*Primary Examiner*—Richard Elms
*Assistant Examiner*—Hien N Nguyen
(74) *Attorney, Agent, or Firm*—Daniel D. Hill; James L. Clingan, Jr.

(57) ABSTRACT

A data processing system (10) has an embedded non-volatile memory (22) that is programmed and erased by use of a high voltage provided by a charge pump (78). In order to prevent the non-volatile memory (22) from being inadvertently programmed or erased during low power supply voltage conditions, the charge pump (78) is disabled and discharged when the power supply voltage drops below a predetermined value. This is accomplished by enabling a low voltage detect circuit (110) in response to a program or erase operation being initiated. A control register (76) will provide a high voltage enable signal to the charge pump (78) only when a power supply valid signal is received. In another embodiment, the low voltage detect circuit (110) may be enabled by another condition to protect the data processing system (10) from an authorized access.

35 Claims, 3 Drawing Sheets

METHOD AND APPARATUS FOR PROTECTING AN INTEGRATED CIRCUIT FROM ERRONEOUS OPERATION

FIELD OF THE INVENTION

The present invention relates generally to integrated circuits, and more particularly, to a method and apparatus for protecting an integrated circuit from erroneous operation.

RELATED ART

Non-volatile memories, such as Electrically Erasable Programmable Read Only Memory (EEPROM) and flash memory, are commonly used in embedded data processing applications. Many non-volatile memory types, such as EEPROM and flash, are programmed using an on-chip charge pump.

Unfortunately, the stored values in these memory types may be subject to being altered unintentionally. For example, the stored state of a memory cell may be altered because the power supply voltage dips, causing, for example, erroneous circuit operation, inadvertently re-programming or erasing the cell.

Low voltage inhibit (LVI) circuitry has been used to prevent the charge pump from being enabled when the power supply voltage is low. However, the LVI circuitry generally requires a reference voltage generator that consumes a significant amount of power. When a data processing system is capable of operating in a low power or standby mode, the LVI circuitry is commonly disabled because of the amount of power it requires, thus exposing the non-volatile memory to the possibility of inadvertent program or erase operations. Therefore, a need exists to protect the data processing system from erroneous operation when the power supply voltage drops. Also, the need exists to protect the non-volatile memory from inadvertent data corruption, even when the LVI circuitry has been disabled.

BRIEF DESCRIPTION OF THE DRAWINGS

The present invention is illustrated by way of example and not limited by the accompanying figures, in which like references indicate similar elements, and in which.

Skilled artisans appreciate that elements in the figures are illustrated for simplicity and clarity and have not necessarily been drawn to scale. For example, the dimensions of some of the elements in the figures may be exaggerated relative to other elements to help improve the understanding of the embodiments of the present invention.

DETAILED DESCRIPTION OF THE DRAWINGS

As used herein, the term "bus" is used to refer to a plurality of signals or conductors which may be used to transfer one or more various types of information, such as data, addresses, control, or status. The conductors as discussed herein may be illustrated or described in reference to being a single conductor, a plurality of conductors, unidirectional conductors, or bidirectional conductors. However, different embodiments may vary the implementation of the conductors. For example, separate unidirectional conductors may be used rather than bidirectional conductors and vice versa. Also, the plurality of conductors may be replaced with a single conductor that transfers multiple signals serially or in a time multiplexed manner. Likewise, single conductors carrying multiple signals may be separated out into various different conductors carrying subsets of these signals. Therefore, many options exist for transferring signals.

Generally, the present invention provides an integrated circuit having a processing unit, a circuit, and a low voltage detection circuit. The circuit, such as for example, a non-volatile memory, is coupled to the processing unit, for implementing a first predetermined operation, such as for example, a program or erase operation, in response to receiving a control signal from the processing unit. The low voltage detection circuit determines if a power supply voltage provided to the integrated circuit is below a predetermined voltage level. In response to the first predetermined operation being performed in the circuit, a voltage detection enable signal is provided to enable operation of the low voltage detection circuit. If the power supply voltage is below the predetermined voltage level, the low voltage detection circuit causes a second predetermined operation to be initiated in the integrated circuit. The second predetermined operation may be, for example, a reset signal or a signal to disable a charge pump for providing a programming voltage.

In another embodiment, the present invention provides a circuit for disabling and discharging the high-voltage charge pump for the nonvolatile memory when the power supply voltage is below a predetermined voltage level. When the charge pump is disabled and discharged, the high-voltage required for programming and erase will not be present and therefore the contents of nonvolatile memory cannot be inadvertently modified.

Figure 1:
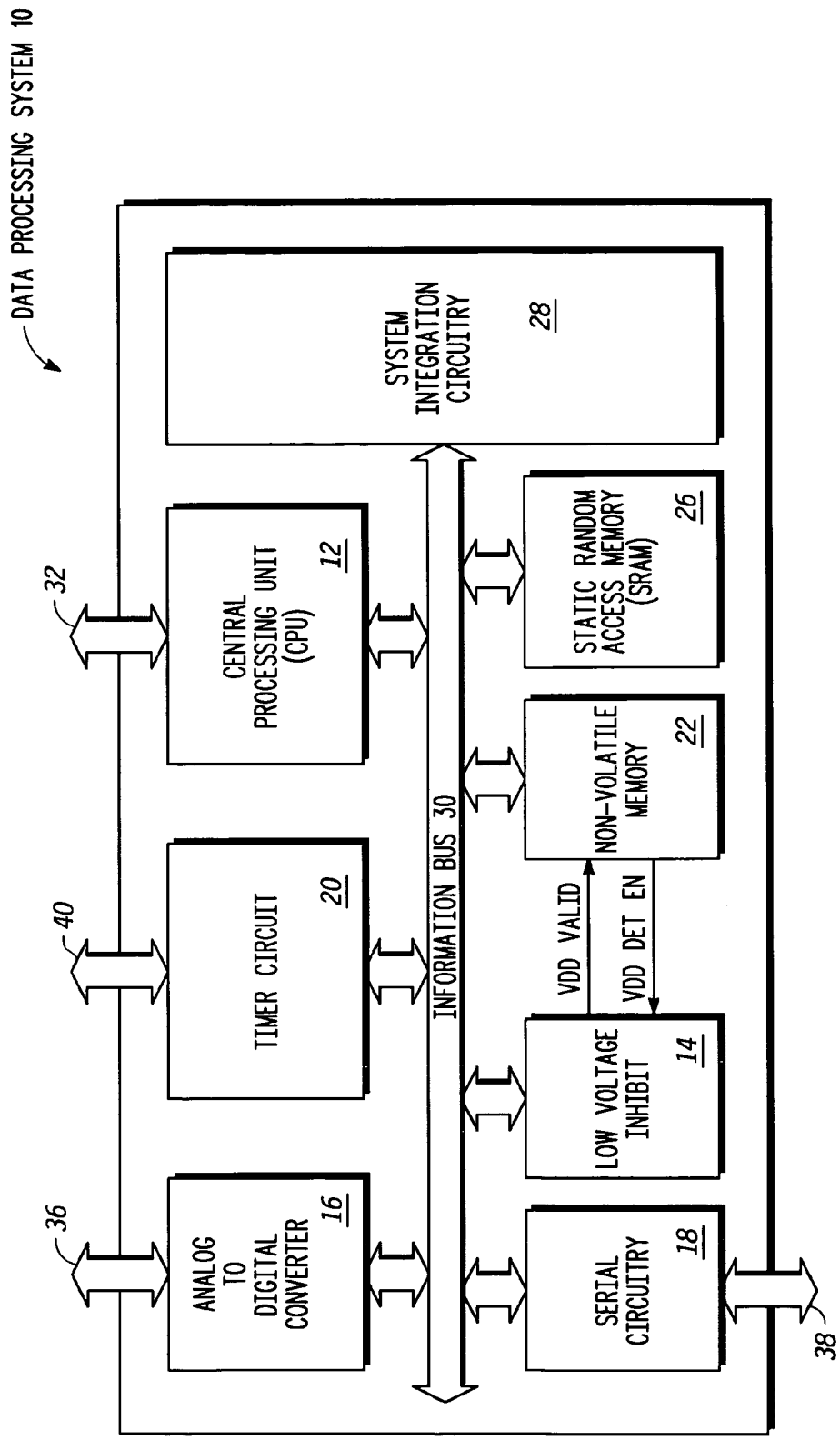
FIG. 1 illustrates, in block diagram form, a data processing system in accordance with an embodiment of the present invention.

FIG. 1 illustrates, in block diagram form, a data processing system 10 in accordance with an embodiment of the present invention. Data processing system 10 can be implemented as a single integrated circuit called a microcontroller. Data processing system 10 has various on-board peripherals which are bi-directionally coupled by way of an information bus 30. The particular embodiment of FIG. 1 has a central processing unit (CPU) 12, a low voltage inhibit circuit 14, an analog-to-digital converter (ADC) 16, serial circuitry 18, timer circuit 20, non-volatile memory 22, a static random access memory 26, and system integration circuitry 28, which are all bi-directionally coupled to the information bus 30. System integration circuit 28 may receive and transmit signals external to data processing system 10 by output terminals (not shown). ADC 16 can receive and transmit signals external to data processing system 10 by way of integrated circuit pins 36. Serial circuitry 18 can receive and transmit signals external to data processing system 10 by way integrated circuit pins 38. Timer circuitry 20 can receive and transmit signals external to data processing system by way of integrated circuit pins 40. The low voltage inhibit circuit 14 provides a signal labeled "VDD VALID" to an input terminal of non-volatile memory 22, and receives a signal labeled "VDD DET EN" from the non-volatile memory 22. The embodiment of FIG. 1 illustrates only one embodiment of the data processing 10. For example, other embodiments of data processing system 10 may not have ADC 16, timer circuit 20, serial circuitry 18, or static random access memory 26. Also, other embodiments of data processing system 10 may have fewer, more, or different peripherals than those illustrated in FIG. 1.

Figure 2:
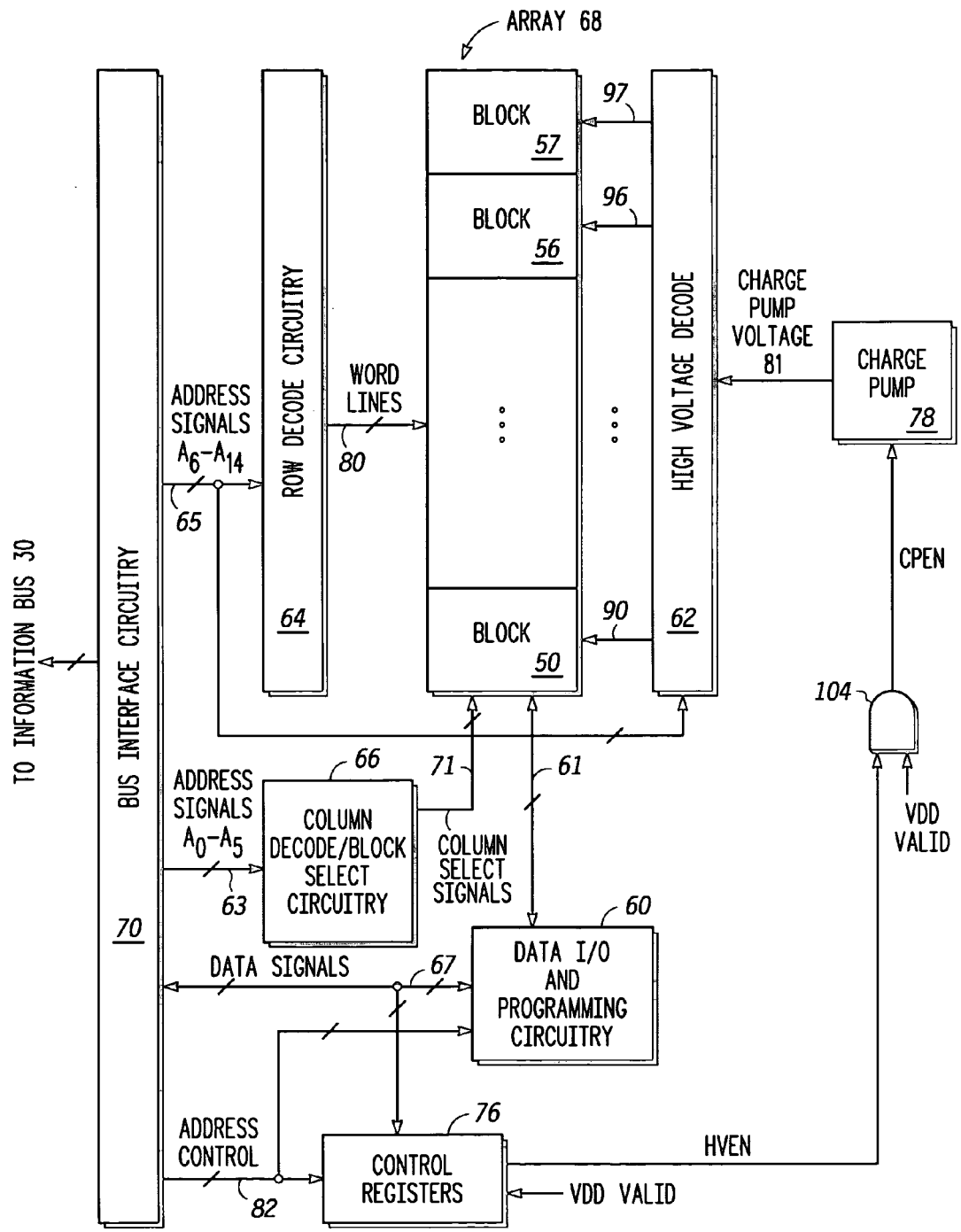
FIG. 2 illustrates, in block diagram form, the non-volatile memory of the data processing system of FIG. 1.

FIG. 2 illustrates, in block diagram form, the non-volatile memory 22 of the data processing system of FIG. 1 in more detail. The non-volatile memory 22 includes an array 68, bus interface circuitry 70, row decode circuitry 64, high voltage decode circuit 62, column decode/block select circuitry 66, data I/O and programming circuitry 60, control registers 76, charge pump 78, and AND logic gate 104. A single array of flash memory cells 68 is divided into a plurality of blocks 50–57. Each block receives a plurality of word lines from row decode circuitry 64. Row decode circuitry 64 and high voltage decode 62 receive address signals 65 from bus interface circuitry 70. Although row decode circuit 64 and high voltage decode 62 in the illustrated embodiment receives address signals A6–A14, row decode circuitry 64 and high voltage decode 62 in alternate embodiments may receive fewer, more or different address signals. Row decode circuit 64 is coupled to array 68 by word lines 80. Bus interface circuitry 70 is coupled to information bus 30 in order to allow non-volatile memory 22 to communicate with other portions of circuitry in data processing system 10. For example, bus interface circuit 70 may receive address and data signals from CPU 12 across information bus 30, and bus interface circuit 70 may transfer data signals back to CPU 12 across information bus 30. Bus interface circuit 70 transfers address signals to column decode circuitry 66 by way of conductors 63. Although column decode circuitry 66 in the illustrated embodiment receives address signals A0–A5, column decode circuitry 66 in alternate embodiments of the present invention may receive fewer, more or different address signals. Column decode/block select circuitry 66 provides column select signals to array 68 by way of conductors 71.

Bus interface circuitry 70 provides address and control signals labeled "ADDRESS CONTROL" to a first input of control registers 76. Likewise, bus interface circuitry 70 provides the ADDRESS CONTROL signals to data I/O and programming circuitry 60. Bus interface circuitry 70 provides data signal labeled "DATA SIGNALS" to a second input of control registers 76. Bus interface circuit 70 transfers address signals and control signals to data I/O and programming circuit 60. The column decode signals are used during read accesses and programming. The block select signals 61 are used during erasing and programming.

Control registers 76 provides a high voltage enable signal labeled "HVEN" to a first input of AND logic gate 104. A second input of AND logic gate 104 receives a signal labeled "VDD VALID" for indicating if the power supply voltage VDD is above a predetermined value. An output of AND logic gate 104 provides a charge pump enable signal labeled "CPEN" to an input of a charge pump 78. Note that the AND logic gate 104 is only intended to illustrate a logical function and may be implemented using one or more other logic gates. Charge pump 78 is a conventional charge pump and functions to provide an elevated charge pump voltage 81 to the array 68 for programming and erasing operations. In other embodiments, the charge pump voltage 81 may be provided by a source external to data processing system 10.

In one embodiment of the present invention, control registers 76 receives the address and control signals ADDRESS CONTROL on conductors 82 and data signals DATA SIGNALS on conductors 67, and sets the values of control bits to perform read, erase, and programming operations on the memory cells of array 68. In the illustrated embodiment, array 68 comprises an array of flash memory cells, but in other embodiments, array 68 may comprise other types of non-volatile memory cells that require an elevated voltage for program and erase, such as for example, an EEPROM.

During normal operation of the non-volatile memory 22, charge pump enable signal CPEN must be asserted as a logical high voltage before charge pump 78 can provide the charge pump voltage 81 to array 68. For CPEN to be asserted as a logical high, both the high voltage enable signal HVEN and the VDD VALID signal must be asserted. The high voltage enable signal HVEN indicates that the charge pump 78 is needed for a program or erase operation and must be enabled. The VDD VALID signal is provided by the low voltage inhibit circuit 14 to indicate that the power supply voltage for the data processing system 10 is above a predetermined value for proper operation. Any time the power supply voltage is found to be lower than necessary for proper operation, then the VDD VALID signal is a logical low voltage, and the charge pump 78 will be disabled and discharged and the HVEN signal will be deasserted. When the supply voltage returns to normal, the VDD VALID signal is again asserted and the charge pump 78 can be enabled when the HVEN signal is re-asserted.

The AND logic gate 104 should be implemented with circuits that operate at lower power supply voltage to ensure that the AND logic gate 104 can perform its functions of disabling the charge pump 78 at low power supply voltages. Also, the AND logic gate 104 should be implemented as close as possible to the charge pump 78 to eliminate the necessity for additional logic that may not operate at low power supply voltages. In one embodiment, the data processing system 10 may be implemented on an integrated circuit using primarily transistors having a relatively high threshold voltage (VT) to achieve low standby power consumption. The AND logic gate 104, OR logic gates 109 and 120, and related circuitry may be implemented using low VT devices to get better tolerance to low power supply voltages.

Some systems are designed to operate with multiple supply voltages. A system operating at a lower supply voltage may not operate reliably at the same clock frequency as a system operating at a higher supply voltage. In those systems that operate on multiple supply voltages, it may be optionally determined if the clock frequency is appropriate for the selected supply voltage and provide the determination as an input to AND logic gate 104. Also, in other embodiments, any other disqualifying condition for proper operation may be sensed during the program or erase operation, and can be used to generate a corresponding signal in order to ensure that no unexpected corruption of nonvolatile memory contents can occur. The other disqualifying conditions may include, for example, a program sequence error, a block protection violation error, and a wrong clock frequency. Further, the disqualifying conditions may be associated with one of the other peripherals or the CPU 12 of data processing system 10. For example, a disqualifying condition may be a security violation, such as an unauthorized attempt to access the data processing system. An unauthorized attempt to access the data processing system 10 may be through a "backdoor" that may be available when the data processing system 10 is caused to operate in a low voltage or power saving mode. In this case, the unauthorized attempt is detected and a control signal is provided to enable the low voltage inhibit circuit 14. The low voltage inhibit circuit 14 then causes a system reset to prevent the unauthorized access.

Figure 3:
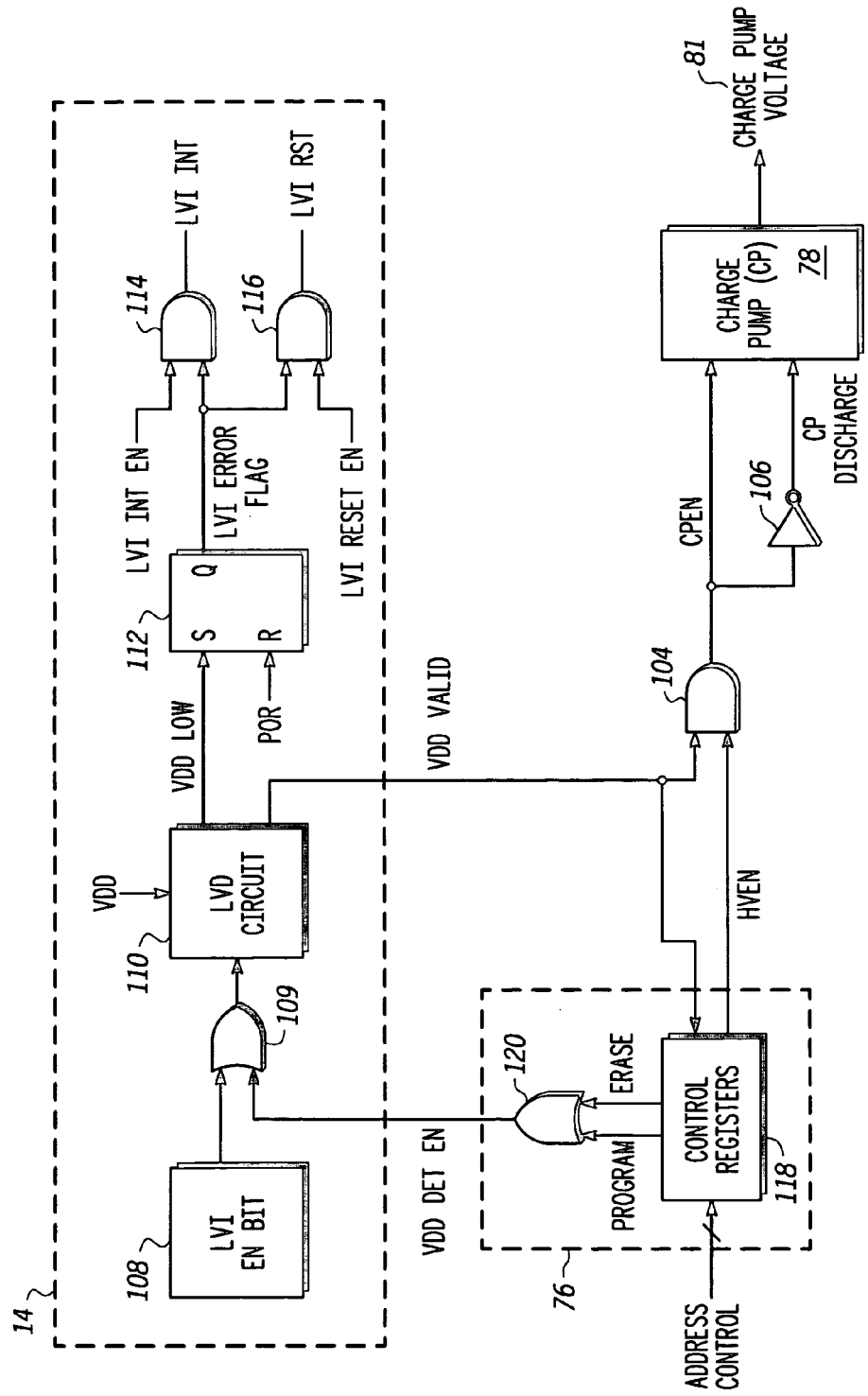
FIG. 3 illustrates, in partial block diagram form and partial logic diagram form, more detail of portions of the data processing system of FIG. 1 and FIG. 2.

FIG. 3 illustrates, in partial block diagram form and partial logic diagram form, the low voltage inhibit (LVI) circuit 14 of FIG. 1 and the control registers 76 of FIG. 2 in more detail. The LVI circuit 14 includes a LVI enable bit 108, an OR logic gate 109, a low voltage detect (LVD) circuit 110, a flip flop 112, and AND logic gates 114 and 116. The control registers 76 includes control registers 118 and OR logic gate 120. Note that the logic gates illustrated in FIG. 3 are only intended to illustrate logical functions and each of the logic gates may be implemented using one or more other logic gates.

In the LVI circuit 14, an LVI enable bit 108 is set by a user to enable or disable operation of the LVI circuit 14. A power supply detection enable signal labeled "VDD DET EN" is generated in response to a program (PROGRAM) or erase (ERASE) operation being initiated by the control registers 118. The LVI enable bit 108 is provided to one input of the OR logic gate 109, and the power supply detection enable signal VDD DET EN is provided to a second input of the OR logic gate 109. Either of these two signals can enable operation of the LVD circuit 110. When enabled, the LVD circuit 110 provides a first output labeled "VDD LOW" when the power supply voltage is below a predetermined value. Also, the LVD circuit 110 will provide a VDD VALID signal at a second output to indicate that the power supply voltage is at or above the predetermined value. In the illustrated embodiment, while the LVD circuit 110 is enabled, the VDD VALID signal is a logical complement of the VDD LOW signal. While the LVD circuit 110 is disabled, both the LVD LOW and the LVD VALID signals are de-asserted. The flip flop 112 has a first input labeled "S" for receiving VDD LOW signal, a second input labeled "R" for receiving a power on reset signal labeled "POR", and an output labeled "Q" for providing a signal labeled "LVI ERROR FLAG". The LVI ERROR FLAG is provided to inputs of AND logic gates 114 and 116. If a LVI interrupt enable signal labeled "LVI INT EN" is asserted, the AND logic gate 114 will provide a logic high LVI interrupt signal LVI INT in response to the AND logic gate 114 receiving a logical high LVI ERROR FLAG. Likewise, if a LVI reset enable signal labeled "LVI RESET EN" is asserted, the AND logic gate 116 will provide a logical high LVI RST signal in response to the AND logic gate 116 receiving a logical high LVI ERROR FLAG.

If the power supply voltage is above the predetermined value, then the VDD VALID signal is asserted and AND logic gate 104 is enabled. As discussed above, the AND logic gate 104 receives signal HVEN from the control registers 118 in response to the control registers 118 determining that the charge pump is needed for a program or erase operation. When the power supply voltage is valid and the HVEN is enabled, the charge pump 78 is enabled to provide CHARGE PUMP VOLTAGE 81. In the illustrated embodiment, an inverter 106 is used to provide a signal (CP DISCHARGE) that is a logical complement of the CPEN signal to discharge the charge pump in the event the power supply voltage is below the predetermined value. Note that in other embodiments, the CP DISCHARGE signal may not be used. If the power supply voltage transitions below the predetermined value, then VDD VALID is de-asserted causing charge pump 78 to be disabled and discharged, and a current program or erase operation will be stopped. The de-asserted VDD VALID signal is also provided to the control registers 118, and control registers 118 causes the HVEN signal to be de-asserted. When the power supply recovers, the HVEN signal must first be asserted before the charge pump 78 can be enabled for a new program or erase operation.

The disclosed embodiment functions to protect the contents of the non-volatile memory array 68 whether or not a user sets the LVI EN BIT 108 to enable the LVI circuit 14. If the user elects to disable the LVI circuit 14 to, for example, save power during a standby mode of operation, the LVI circuit 14 can be enabled in response to the control registers 118 commanding a program or erase operation. The LVD circuit 110 of LVI circuit 14 is enabled by the control registers 118 asserting a PROGRAM or ERASE signal. The LVD circuit 110 is enabled even though the LVI EN BIT 108 is not set. In the event a low voltage is detected by the LVD circuit 110, the VDD VALID signal is asserted as a logic low voltage, causing the AND logic gate 104 to provide a logic low CPEN signal to disable and discharge the charge pump 78. The charge pump will remain disabled and discharged, and cannot be enabled as long as the low voltage condition exists, thus protecting the contents of array 68 from being corrupted.

In another embodiment, another control signal from the control registers 76 may be used to enable the LVD circuit 110 instead of the program and erase signals. For example, the VDD DET EN signal may be provided by a monitor mode bit or an internal test circuit bit to prevent an unauthorized access to the non-volatile memory or other portion of the data processing system 10. Also, instead of disabling the charge pump, via the VDD valid signal to AND logic gate 104, the VDD valid signal may be provided to, for example, the LVI RESET EN input of AND logic gate 116. Then, in the event of an unauthorized access, the LVD circuit 110 will be enabled to cause a system reset operation to a predetermined condition.

In the foregoing specification, the invention has been described with reference to specific embodiments. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of the present invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. The terms a or an, as used herein, are defined as one or more than one. The terms including and/or having, as used herein, are defined as comprising (i.e., open language). As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. An integrated circuit comprising:
 a processing unit for executing instructions;
 a circuit, coupled to the processing unit, for implementing a first predetermined operation in response to receiving a control signal from the processing unit; and
 a low voltage detection circuit for determining if a power supply voltage provided to the integrated circuit is below a predetermined voltage level, wherein in response to the first predetermined operation being performed in the circuit, a voltage detection enable signal is provided to enable operation of the low voltage detection circuit, and if the power supply voltage is below the predetermined voltage level, the low voltage detection circuit for causing a second predetermined operation to be initiated in the integrated circuit.

2. The integrated circuit of claim 1, wherein the integrated circuit is a microcontroller having the processing unit and one or more peripherals.

3. The integrated circuit of claim 1, wherein the circuit is a non-volatile memory.

4. The integrated circuit of claim 3, wherein the first predetermined operation is one of a program operation or an erase operation.

5. The integrated circuit of claim 3, wherein the second predetermined operation causes the first predetermined operation to be stopped.

6. The integrated circuit of claim 5, further comprising a charge pump coupled to the non-volatile memory, wherein the second predetermined operation causes the charge pump to be disabled.

7. The integrated circuit of claim 1, wherein the second predetermined operation causes the integrated circuit to be reset to an initial condition.

8. The integrated circuit of claim 1, wherein the control signal is provided by a control register coupled to the circuit.

9. A circuit comprising:
a first logic circuit for providing a first detection enable signal responsive to program and erase signals;
a voltage detection circuit coupled to a power supply terminal for asserting a voltage valid signal in response to the detection enable signal if a voltage at the power supply terminal is above a predetermined level;
a second logic circuit for generating a charge pump enable signal in response to the voltage valid signal; and
a charge pump that is discharged in response to the charge pump enable signal not being asserted.

10. The circuit of claim 9, wherein the voltage detection circuit is a portion of a low voltage inhibit circuit.

11. The circuit of claim 10, wherein the low voltage inhibit circuit comprises:
a control register bit having an output for providing a second detection enable signal;
a third logic circuit for receiving the first detection enable signal and the second detection enable signal and an output coupled to the voltage detection circuit;
the voltage detection circuit coupled to the third logic circuit; and
a fourth logic circuit coupled to the voltage detection circuit for providing a low voltage interrupt signal.

12. The circuit of claim 9, wherein the first logic circuit and the second logic circuit include a transistor that has a relatively lower threshold voltage than other transistors of the circuit for providing more reliable operation when the voltage at the power supply terminal is below the predetermined level.

13. A method of disabling a charge pump, comprising:
providing a first detection enable signal responsive to one of a program signal and an erase signal;
providing a voltage valid signal in response to the first detection enable signal if a voltage at the power supply terminal is above a predetermined level; and
disabling the charge pump in response to the voltage valid signal not being asserted.

14. The method of claim 13, wherein the charge pump is further characterized as generating a high voltage for programming and erasing a non-volatile memory when the charge pump is enabled.

15. The method of claim 14, wherein the disabling is further characterized as disabling the charge pump in response to a high voltage enable signal when the high voltage enable signal is not asserted.

16. The method of claim 15, wherein the high voltage enable signal is not asserted in response to one or more of:
a block protection signal being asserted;
an occurrence of a program or erase control sequence error, a reset signal is asserted; and
the voltage valid signal is not being asserted.

17. The method of claim 16, further comprising:
providing a second detection enable signal from a register;
wherein the providing the voltage valid signal further comprises:
generating a third detection enable signal responsive to one or both of the first and second detection enable signals being asserted.

18. A method of preventing programming or erasing of a non-volatile memory that is coupled to a power supply terminal and that is programmed and erased using a high voltage, comprising:
providing a first detection enable signal responsive to one of a program signal and an erase signal;
providing a voltage valid signal in response to the first detection enable signal if a voltage at the power supply terminal is above a predetermined level; and
preventing the high voltage from being applied to the non-volatile memory in response to the voltage valid signal not being asserted.

19. The method of claim 18, wherein the non-volatile memory is part of an integrated circuit and the high voltage is provided external from the integrated circuit, and wherein the preventing the high voltage comprises blocking the high voltage from reaching the non-volatile memory.

20. The method of claim 18, wherein the preventing the high voltage comprises disabling a charge pump in response to the voltage valid signal not being asserted.

21. The method of claim 18, wherein the high voltage enable signal is not asserted in response to one or more of (1) a block protection signal being asserted, (2) an occurrence of a program or erase control sequence error, (3) a reset signal is asserted, and (4) the voltage valid signal is not being asserted.

22. The method of claim 18, further comprising:
providing a second detection enable signal from a register;
wherein the providing the voltage valid signal further comprises:
generating a third detection enable signal responsive to one or both of the first and second detection enable signals being asserted.

23. The method of claim 22, further comprising generating a voltage low signal in response to the voltage at the power supply terminal being below the predetermined voltage and generating a low voltage interrupt signal in response to the voltage low signal being generated.

24. A processing unit having an embedded non-volatile memory that is programmed and erased using a high voltage, comprising
a processing unit, coupled to a power supply terminal, for generating address control signals;
a control circuit for generating a first detection enable signal in response to the address control signals; and
a voltage detection circuit for generating a voltage valid signal in response to the first detection enable signal if a voltage at the power supply terminal is above a predetermined voltage; and prevention means for preventing the high voltage from reaching the non-volatile memory in response to the voltage valid signal not being asserted.

25. The processing unit of claim 24, wherein the high voltage is generated external to the processing unit and the prevention means blocks the high voltage from reaching the non-volatile memory.

26. The processing unit of claim 24, wherein the prevention means comprises a charge pump that is disabled in response to the voltage valid signal not being asserted.

27. The processing unit of claim 26, wherein the control circuit comprises:

a control register for generating a program signal and a erase signal in response to the address control signals; and a first logic circuit for generating the first detection enable signal in response to the program and erase signals.

28. The processing unit of claim 27, further comprising a register for providing a second detection enable signal, wherein the first logic circuit comprises:

a second logic circuit having a first input for receiving the program signal, a second input for receiving the erase signal, and an output; and a third logic circuit having a first input for receiving the second detection enable signal, a second input coupled to the output of the second logic circuit, and an output for providing the first detection enable signal.

29. The processing unit of claim 28, wherein the voltage detection circuit is further characterized as generating a voltage low signal in response to the voltage at the power supply terminal being below the predetermined voltage, further comprising logic means for generating a low voltage interrupt signal in response to the voltage low signal.

30. A circuit for preventing a change in logic states of memory cells of a non-volatile memory in which the change in logic states occurs by use of a high voltage, comprising a control circuit for generating a first detection enable signal in response to a state change signal indicating an intent to change logic states of one or more memory cells in the non-volatile memory; and a voltage detection circuit for generating a voltage valid signal in response to the first detection enable signal if a voltage at the power supply terminal is above a predetermined voltage; and prevention means for preventing the high voltage from reaching the non-volatile memory in response to the voltage valid signal not being asserted.

31. The processing unit of claim 30, wherein the high voltage is generated external to the processing unit and the prevention means blocks the high voltage from reaching the non-volatile memory.

32. The processing unit of claim 30, wherein the prevention means comprises a charge pump that is disabled in response to the voltage valid signal not being asserted.

33. The processing unit of claim 30, wherein the control circuit is further characterized as generating the state change signal in response to one of a program signal and an erase signal.

34. The processing unit of claim 33, further comprising a register for providing a second detection enable signal, wherein the control circuit receives the second detection enable signal and provides the first detection enable signal in response to the second detection enable signal being asserted.

35. The processing unit of claim 34, wherein the voltage detection circuit is further characterized as generating a voltage low signal in response to the voltage at the power supply terminal being below the predetermined voltage, further comprising logic means for generating a low voltage interrupt signal in response to the voltage low signal.

* * * * *